United States Patent [19]

Nowogrodzki

[11] Patent Number: 4,484,155
[45] Date of Patent: Nov. 20, 1984

[54] CHANNELIZED FREQUENCY MEMORY SYSTEM EMPLOYING FEEDBACK

[75] Inventor: Markus Nowogrodzki, Sussex, N.J.

[73] Assignee: RCA Corporation, New York, N.Y.

[21] Appl. No.: 363,867

[22] Filed: Mar. 31, 1982

[51] Int. Cl.³ .............................. G01S 7/30; H03B 5/00
[52] U.S. Cl. ........................................ 331/49; 331/56; 331/173; 343/5 SA; 343/17.1 R
[58] Field of Search ............... 331/49, 56, 59, 165, 331/172, 173, 174; 328/21, 138; 324/78 E, 78 F; 343/7 A, 7 AG, 7 PL, 18 E, 5 SA, 17.1 R

[56] References Cited

U.S. PATENT DOCUMENTS 4,145,691  3/1979  Freeling et al. ..................... 343/7
4,398,196  8/1983  Wiegand ........................ 343/17.1 R Primary Examiner—Siegfried H. Grimm
Assistant Examiner—Robert Pascal
Attorney, Agent, or Firm—J. S. Tripoli; R. L. Troike; R. E. Smiley

[57] ABSTRACT

A frequency memory module responsive to an input relatively short duration RF burst signal of center frequency f for producing an output signal at center frequency f for a relatively long duration includes a narrow band filter tuned to pass frequency f which is receptive of the input signal, an amplifier connected to the output of the filter and feedback means connected from the output of the amplifier to the input of the filter. Because of the feedback the frequency memory module sustains oscillations at frequency f long after the input pulse is removed from the filter.

7 Claims, 1 Drawing Figure

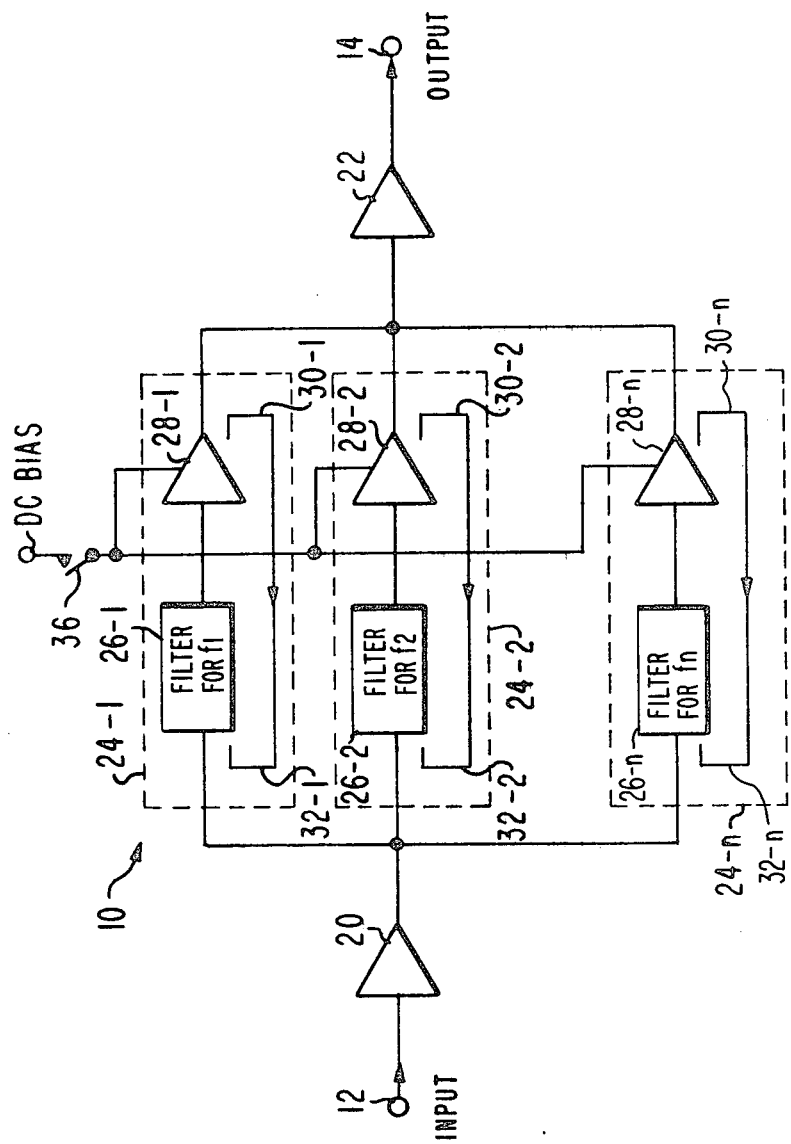

CHANNELIZED FREQUENCY MEMORY SYSTEM EMPLOYING FEEDBACK

This invention relates to frequency memory systems and more particularly to such systems which utilize the input signal as part of the output signal for providing a relatively long duration output signal.

There are a number of known systems which are responsive to a relatively short duration RF burst signal of unknown frequency for producing an output signal with the same frequency for a relatively long time duration. Some systems utilize a voltage-controlled oscillator (VCO) which is set by the short duration input signal. Since the input signal is not passed to the system output, but rather the output signal is generated by the VCO, such systems are unacceptably slow to produce an output signal of the proper frequency. Other systems utilize a section of transmission line in a so called "loop memory." Such systems, although fast to produce an output signal following receipt of an input signal, can sustain the signal for only a short time (on the order of a small fraction of a millisecond) after the input signal is removed owing to noise buildup in the loop. Other systems which are able to provide a fast output upon receipt of an input signal and sustain the output signal for a long duration after the cessation of the input signal are extremely bulky and complicated, such as, for example, channelized receivers.

In accordance with a preferred embodiment of the invention, a frequency memory system coupled between an input terminal, to which may be applied, from an external source, an RF burst signal of center frequency f to be memorized, and an output terminal, comprises a bandpass filter tuned to pass a signal of center frequency f, while rejecting frequencies outside the band $f \pm \Delta f$, coupled to the input terminal at its input and an amplifier adapted to pass frequency f coupled between the output of the filter and the output terminal. A means is coupled between the output of the amplifier and the input to the filter to provide feedback to cause and sustain oscillations at frequency f after a first signal of center frequency f is applied to the input terminal. In the drawing:

The sole FIGURE is a frequency memory system in electrical block diagram form in accordance with a preferred embodiment of the present invention.

With reference to the sole FIGURE, a frequency memory system 10 is connected between a system input terminal 12, to which may be applied RF burst signals of arbitrarily short duration containing one or more frequencies in the band from f1 through fn, and a system output terminal 14 which produces an RF signal containing the frequency or frequencies of the input RF burst signal applied at terminal 12 and of relatively long duration.

Input terminal 12 is coupled to a first broadband linear amplifier 20 while the output of a similar amplifier 22 is coupled to output terminal 14. Amplifiers 20 and 22 are capable of amplifying signals in the band from frequency f1 through fn. By way of example, f1 may be 4 gigahertz (GHz) and fn may be 8 GHz. The output of amplifier 20 is coupled to the input of each of a plurality of frequency memory modules 24-1, 24-2 . . . 24-n. In the sole FIGURE only three of the modules are shown. The number of modules required depends on the input signal bandwith fn-f1 and the resolution desired of the system. For the exemplary system having a 4 GHz bandwith, n may be 40 or more such that each module passes a 100 megahertz (MHz) or less signal. Each module, as for example 24-1, comprises a filter 26-1 which is coupled to the output of amplifier 20 and an amplifier 28-1 coupled between the output of the filter and the input to amplifier 22. Each filter passes a different 100 MHz or less band of frequencies.

A feedback means to sustain oscillation in a manner to be described comprises a pair of directional couplers 30-1 and 32-1 coupled together to receive the output signal from amplifier 28-1 and pass a feedback signal to filter 26-1. It is noted that the coupling coefficients of directional couplers 30-1 and 32-1, for example, may be appreciably different. At the output of amplifier 28-1, only a small fraction of the output power may be coupled via directional coupler 30-1 for feedback purposes, so that coupler 30-1 may typically be a 10-dB coupler; at the input of filter 26-1. However, it may be desired to couple most of the feedback power into the filter, so that directional coupler 32-1 may typically be a 3-dB coupler. To optimize the operation of the overall memory sytem, given the operating characteristics of the various amplifiers 28, the coupling coefficients of the various couplers may be different, so that, for example, couplers 30-1, 30-2, 32-1, and 32-2 may all have different coupling efficiencies.

The filter associated with each frequency memory module passes a unique band of frequencies. That is, the filter 26-1 associated with frequency module 24-1 is a narrow bandpass filter adapted to pass frequencies $f1 \pm \Delta f$ where $\Delta f$ for the example is 50 MHz. The filter 26-2 of frequency memory module 24-2 is arranged to pass frequencies $f2 \pm \Delta f$, etc. For the above system covering 4 GHz bandwidth with 40 modules f2 is 100 MHz higher than f1, f3 is 100 MHz higher than f2, etc. Each amplifier such as 28-1 must be adapted to amplify the particular frequency passed by its associated filter such as 26-1. As a practical matter it is simpler, however, to make each of the amplifiers such as 28-1 a broadband amplifier so that it will, in fact, pass any of the frequencies f1 through fn or part of the frequency band fn-f1. Each filter 26 (a filter, amplifier or directional coupler without a dash and a number following the dash refers to any of those respective components) may typically be an active filter of the type described in U.S. patent application Ser. No. 070,022 filed Aug. 27, 1979 by A. Presser, now U.S. patent 4,338,582 issued July 6, 1982. An amplifier 28 typically comprises a gallium arsenide field effect transistor (GaAs FET).

Operation of a module of the frequency memory system in the sole FIGURE is as follows. Assume an input RF burst signal containing a frequency f2 is applied to input terminal 12 from a source (not shown) such as from a microwave frequency broadcasting source. The RF burst signal is amplified by amplifier 20 and passed to all of frequency memory system modules 24 in parallel. Because the RF burst signal is of frequency f2 the signal will be passed by narrow band pass filter 26-2 to amplifier 28-2 while being rejected by filters of other modules such as 26-1.

The RF burst signal is amplified by amplifier 28-2 and passed to output power amplifier 22 for further amplification and then to output terminal 14 to be utilized in a suitable manner such as to be applied to a transmitter for broadcasting. The only delay from the receipt of the input RF burst signal at terminal 12 to the production of the RF signal at terminal 14 is due to the very small delays in components 20, 26-2, 28-2 and 22, a delay which is typically on the order of nanoseconds.

When the RF signal f2 appears at the output of amplifier 28-2 a sufficient fraction of the signal is picked up at directional coupler 30-2 and fed back to directional coupler 32-2 to be applied to the input of filter 26-2 causing by the combination of filter 26-2, amplifiers 28-2 and couplers 30-2 and 32-2 oscillation at frequency f2 while rejecting noise at frequencies outside the passband of the filter. At any time after the feedback from amplifier 28-2 to filter 26-2 occurs, the input RF burst signal may be removed at terminal 12 and oscillations sustained by the feedback will cause amplifier 28-2 to continue to produce the center frequency f2 or substantially f2 for an indefinite but very long period of time depending on the accuracy of the components 28-2 and 26-2.

The oscillation is interrupted and therefore output RF signal at terminal 14 is terminated by, for example, the removal of DC bias from amplifier 28-2 such as by momentarily opening switch 36. Thereafter, if another input RF burst signal of any frequency between f1 and fn is applied to terminal 12, operation is as described above.

It will be understood that the input RF burst signal could contain several of the frequencies in the band between f1 and fn. In such a situation the RF burst signal would be passed by more than one filter 26 such that several frequency modules could be operating simultaneously. It will also be realized in some situations it may be desirable to have individual switches similar to switch 36 for each amplifier 28 and to interrupt only those switches associated with amplifiers which are in oscillation and at which oscillation is desired to be terminated. It may also be desirable in some instances not to have the memory system react to certain frequencies in the band fn–f1, in which case the pertinent individual modules may be temporarily disabled by interrupting the switches associated with the amplifiers contained in those modules.

What is claimed is:

1. A frequency memory module comprising, in combination:
   a module input terminal to which may be applied, from an external source, a radio frequency (RF) burst signal of a center frequency f;
   a module output terminal;
   a bandpass filter having an input coupled to said module input terminal for passing an RF signal of center frequency f applied thereto while rejecting signals at frequencies outside the band $f \pm \Delta f$;
   an amplifier coupled at its input to the output of said filter and coupled at its output to said module output terminal, said amplifier capable of amplifying frequencies $f \pm \Delta f$ when applied thereto through said filter from said external source; and
   means responsive to the RF signal produced at the output of said amplifier upon receipt of said RF burst signal for feeding back sufficient RF signal over the frequencies $f \pm \Delta f$ when produced at said amplifier output to said input of said filter for causing said filter and said amplifier to produce oscillation over the frequencies $f \pm \Delta f$ after said RF burst signal has ceased, whereby when said RF burst signal of frequency $f \pm \Delta f$ is applied to said input terminal said module sustains oscillations at frequencies $f \pm \Delta f$.

2. The combination as set forth in claim 1 wherein said module includes means for interrupting the oscillation in said module to terminate the production of signal at frequency f at said module output terminal.

3. The combination as set forth in claim 2 wherein the means for interrupting said oscillation comprises means for causing said amplifier to cease operation.

4. The combination of claim 1 wherein $\Delta f$ is no greater than 0.1 f.

5. A frequency memory system comprising, in combination:
   an input terminal to which may be applied an RF burst signal at a center frequency f in the band from f1 through fn;
   an output terminal;
   a plurality of frequency memory modules, each coupled between said input terminal and said output terminal;
   each said frequency memory module comprising a bandpass filter coupled to said input terminal, an amplifier coupled between said filter and said output terminal and feedback means from the output of said amplifier to the input of said filter, said filter being adapted to pass an RF signal having a center frequency in the band from f1 through fn, each filter passing a different center frequency from that of the other filters, whereby when a particular frequency is applied at said input terminal in the band f1 through fn the associated filter with the closest center frequency passes said frequency to said amplifier and the frequency is sustained after said burst signal ceases by oscillations due to said feedback means and amplifier gain.

6. The combination as set forth in claim 5 further including means for terminating said oscillation in each said frequency memory module.

7. The combination as set forth in claim 6 wherein said means for terminating oscillations comprises means coupled to each said amplifier for terminating its gain.

* * * * *